US008044307B2

(12) United States Patent
Anger et al.

(10) Patent No.: US 8,044,307 B2

(45) Date of Patent: Oct. 25, 2011

(54) POWER TRANSFORMER/REACTOR

(75) Inventors: Jan Anger, Ludvika (SE); Mats Bernesjö, St. Charles, MO (US); Ramsis Girgis, Wildwood, MO (US)

(73) Assignee: ABB Technology Ltd., Zürich (CH)

( * ) Notice: Subject to any disclaimer, the term of this patent is extended or adjusted under 35 U.S.C. 154(b) by 340 days.

(21) Appl. No.: 12/521,675

(22) PCT Filed: Dec. 18, 2007

(86) PCT No.: PCT/EP2007/064103

§ 371 (c)(1),
(2), (4) Date: Jun. 29, 2009

(87) PCT Pub. No.: WO2008/080820

PCT Pub. Date: Jul. 10, 2008

(65) Prior Publication Data

US 2010/0277886 A1 Nov. 4, 2010

(30) Foreign Application Priority Data

Dec. 28, 2006 (SE) .................................... 0602830-2

(51) Int. Cl.
*H05K 5/00* (2006.01)

(52) U.S. Cl. .............. 174/520; 336/58; 336/65; 336/90; 361/836

(58) Field of Classification Search .................. 174/520; 336/58, 65, 90, 105; 361/836
See application file for complete search history.

(56) References Cited

U.S. PATENT DOCUMENTS

| | | | | |
|---|---|---|---|---|
| 3,175,174 | A | 3/1965 | Simmons | |
| 3,844,030 | A * | 10/1974 | Wilkinson | 29/592.1 |
| 4,644,314 | A * | 2/1987 | Fukatsu | 336/58 |
| 5,184,104 | A | 2/1993 | Kondo | |
| 5,889,231 | A | 3/1999 | Marusinec et al. | |
| 7,317,598 | B2 * | 1/2008 | Magnier | 361/37 |
| 7,646,276 | B2 * | 1/2010 | Yang et al. | 336/83 |
| 7,667,563 | B2 * | 2/2010 | Blanke | 336/65 |

FOREIGN PATENT DOCUMENTS

| | | |
|---|---|---|
| JP | 56042314 A | 4/1981 |
| JP | 62076609 A | 4/1987 |

OTHER PUBLICATIONS

PCT/ISA/210—International Search Report—Mar. 11, 2008.
PCT/ISA/237—Written Opinion of the International Searching Authority—Mar. 11, 2008.
PCT/IPEA/409—International Preliminary Report on Patentability—Jan. 20, 2009.
PCT/ISA/201/SE—International-Type Search Report—May 30, 2007.

* cited by examiner

*Primary Examiner* — Dhirubhai R Patel
(74) *Attorney, Agent, or Firm* — Venable LLP; Eric J. Franklin

(57) ABSTRACT

A power transformer/reactor immersed in oil including a transformer/reactor core and windings accommodated in a tank including a tank base plate and tank walls. A foundation supports the tank. An elongated continuous band forming a closed frame is arranged between the base plate and the foundation. An outer periphery of the base plate extends outside an inner periphery of the frame and thereby encloses an air volume within the frame, the base plate and foundation. The tank support reduces sound emitted from the transformer/reactor.

10 Claims, 3 Drawing Sheets

POWER TRANSFORMER/REACTOR

CROSS-REFERENCE TO RELATED APPLICATIONS

This application claims priority to Swedish patent application 0602830-2 filed Dec. 28, 2006 and is the national phase under 35 U.S.C. §371 of PCT/SE2007/064103 filed 18 Dec. 2006.

FIELD OF THE INVENTION

The present invention relates generally to a power transformer/reactor immersed in oil comprising transformer/reactor core and windings accommodated in a tank comprising tank base plate and tank walls, a foundation supporting the tank.

DESCRIPTION OF THE BACKGROUND ART

It is well-known that the magnetic core is a source of sound in an electrical power transformer or reactor. Energization of the electrical windings surrounding a magnetic core results in alternating magnetization of the core, and the core laminations cyclically expand and contract due to the phenomena of magnetostriction when magnetized and demagnetized by the current flowing in the transformer windings. The magnetic core thus acts as a source of 100 Hz or twice the operating frequency of the transformer/reactor vibrations and harmonics thereof. The vibrations generated by the magnetic core together with the weight of the core and core assembly may force the rigid base structure beneath a transformer/reactor casing into vibration. The casing sidewalls are rigidly connected to the base structure and may be driven into vibration by the stiff base members and propagate noise.

In oil immersed power transformers or reactors, to which the present invention relates, the transformer/reactor core and core assembly is placed in a transformer/reactor tank, and the vibrations are propagating by the tank base and the oil to the tank walls causing noise.

The transformer/reactor tank of oil immersed power transformers/reactors is according to prior art are supported on a concrete foundation by supporting means. The present invention seeks to provide an improved transformer/reactor tank support reducing the sound level emitted from the transformer/reactor.

SUMMARY OF THE INVENTION

According to an aspect of the present invention there is provided an elongated continuous band forming a closed frame which is arranged between the base plate and the foundation and the outer periphery of the base plate extends outside the inner periphery of the frame and thereby enclosing an air volume within the frame, the base plate and foundation. Hereby the sound radiation from underneath the transformer is effectively closed off and also structural vibrations caused by uneven mounting are eliminated.

According to an embodiment of the invention the vertical projection of the tank walls fall on the width of the band.

According to an embodiment of the invention the vertical projection of the tank walls fall at the central part of the width of the band.

According to an embodiment of the invention the vertical projection of the frame forms the full support of the base plate forming the vertical mechanical support of the transformer core. The base plate hereby provides an elastic support of the transformer assembly which have shown to limit the noise created by the vibrations in the core.

According to an embodiment of the invention the vertical projection of the vertical projection of the nodal point of the oscillation of the base plate caused by the vibrations in the core falls on the central part of the band.

According to an embodiment of the invention the vertical projection of the band is made of oil resistant solid rubber.

According to an embodiment of the invention the vertical projection of the band have a thickness exhibit a thickness between 10 mm–50 mm, preferably between 20 mm–25 mm and a width between 10 mm–100 mm. The band hereby has a thickness to ensure that the base plate not came in contact with the foundation. The band hereby has a width which ensures that pressure on the band not will be to high and a width which not exceeds this value which give to high stiffness rubber.

According to an embodiment of the invention the vertical projection of the pressure on the band caused by the total weight of the transformer tank is in the range 0,5-1,0 N/mm$^2$, preferably 0,7 N/mm$^2$ and the rubber hardness is in the range 30A-40A durometer.

According to an embodiment of the invention the vertical projection of the foundation comprises concrete forming a plane surface.

Test has showed that the reductions achieved by the transformer tank support according to the invention compared with conventional tank support on wood blocks are as follows:

4-6 dB at 100/120 Hz, no-load and load noise 3-4 dB at 200/240 Hz 2-3 dB at 300/360 Hz

BRIEF DESCRIPTION OF THE DRAWINGS

In the following the description, by way of example, will be related to power transformer but the invention relates to power reactor as well. Thus the transformer core and winding and tank can be replaced by reactor core and winding.

An embodiment of the present invention is thus described below, by way of example only, in greater detail with reference to the accompanying drawings, where FIG. 1*a-c* schematically shows transformer support according to the prior art, FIG. 2 schematically shows transformer support according to an embodiment of the invention, FIG. 3 schematically shows a cross section of a transformer tank with transformer support according to an embodiment of the invention, FIG. 4 schematically shows cross section of a transformer tank corner according to section A in FIG. 4.

DETAILED DESCRIPTION OF PREFERRED EMBODIMENTS

In the description and the figures below, the invention is exemplified for a power transformer, whereas the invention as such, as is apparent to the skilled person in the art, is applicable also to power reactor.

Figure 1A:
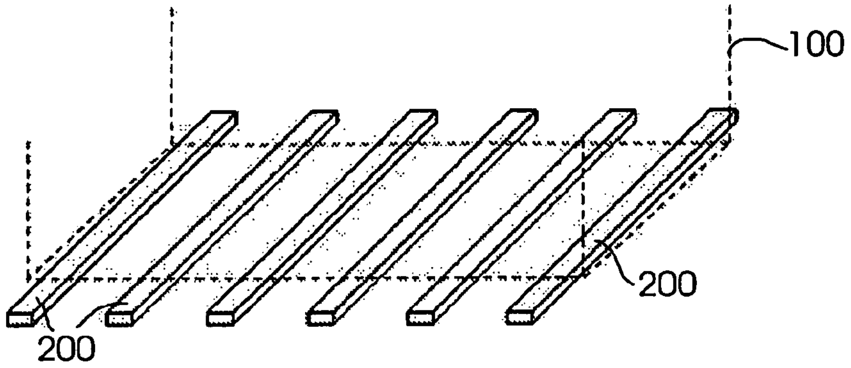
Fig 1a (prior art)
Figure 1B:
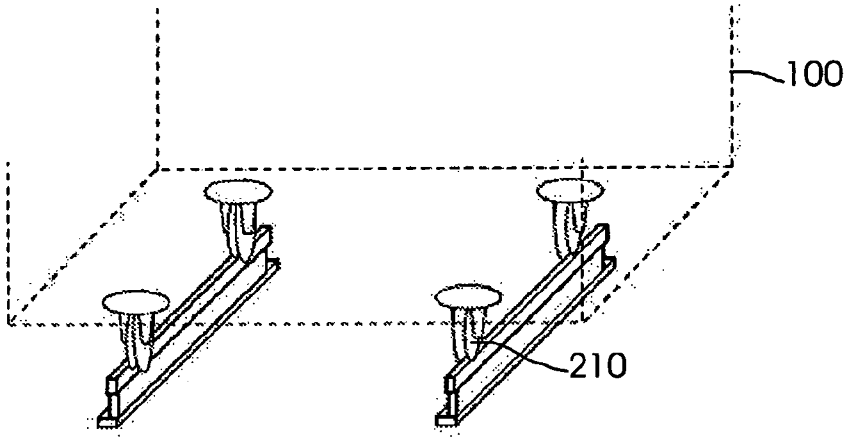
Fig 1b (prior art)
Figure 1C:
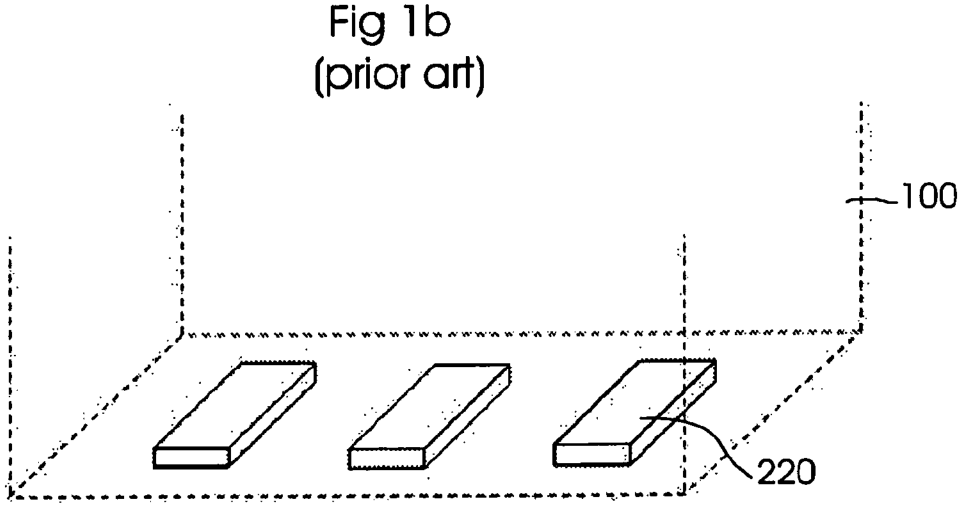
Fig 1c (prior art)

In FIG. 1*a-c* schematically shows transformer support according to the prior art. A transformer tank 100 filled with oil is schematically shown by dotted lines comprising an oil immersed transformer (not shown) with an transformer assembly comprising transformer core and windings.

The transformer tank 100 is in FIG. 1*a* supported by wood strips or blocks 200.

In FIG. 1*b* the transformer tank is supported by wheels or pillars 210.

In FIG. 1*c* the transformer tank is supported by pads 220, which preferably are located under the transformer assembly.

The pads are made of elastic material as rubber to absorb vibration.

Figure 2:
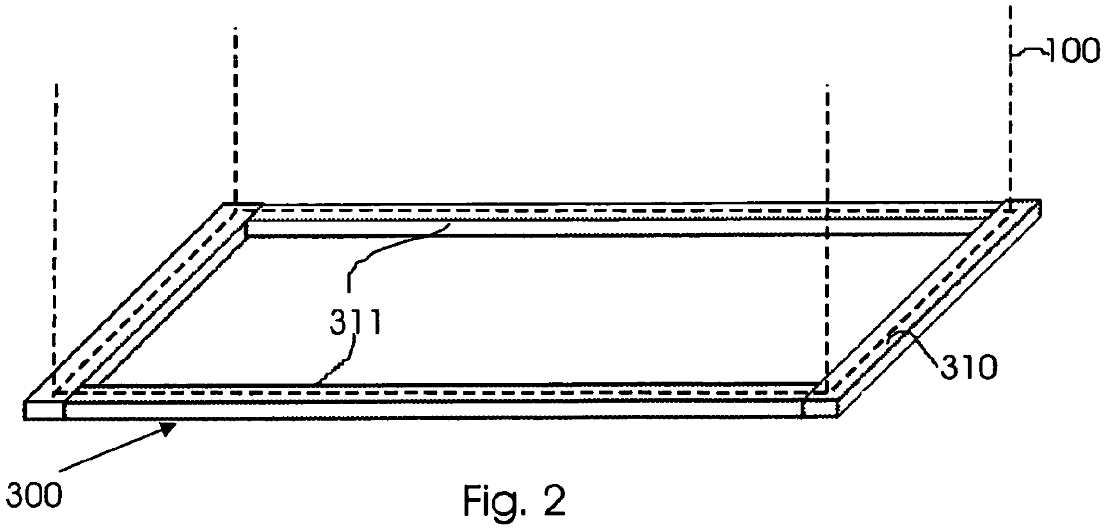

An embodiment of the invention is shown in FIG. 2, which schematically shows a transformer tank 100 supported only by an elongated continuous band 310 forming a closed frame 300. For the sake of clarity, in the drawings the dimensions of the band and frame have been exaggerated.

Figure 3:
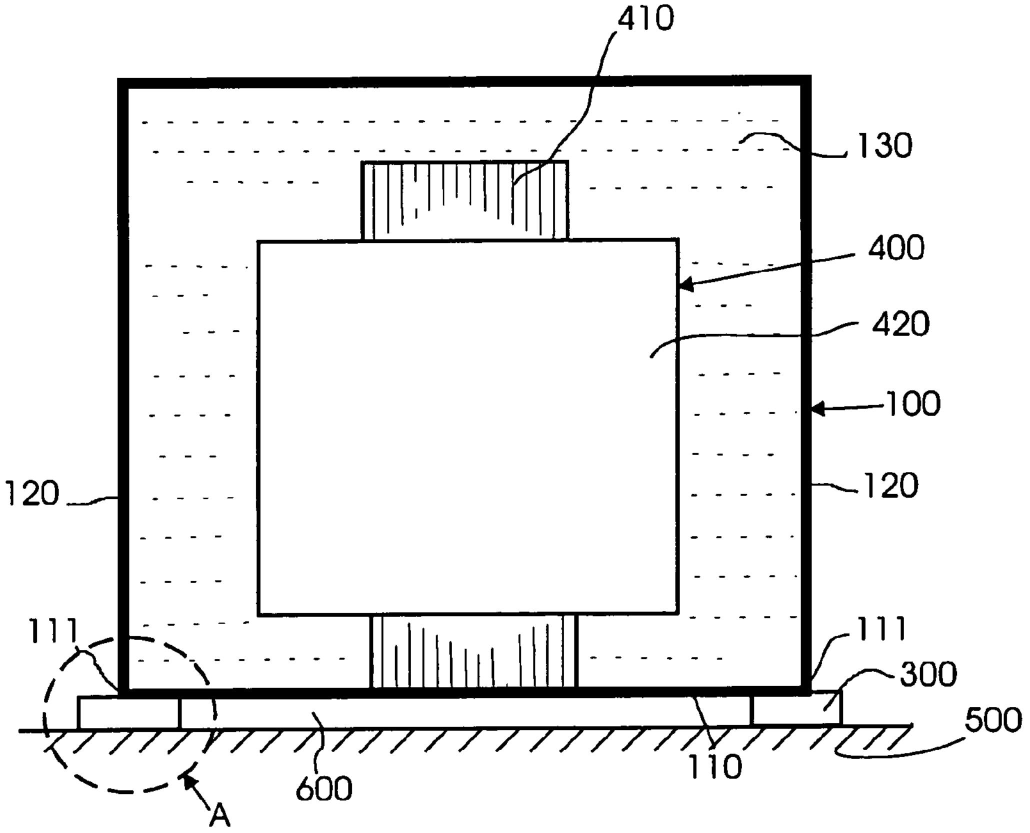

FIG. 3 is a cross section of a transformer tank 100 with a transformer assembly in the tank and immersed in transformer oil 130. The transformer assembly 400 comprises transformer core 410 and windings 420. The transformer tank 100 comprises a tank base plate 110 and vertical tank walls 120. The transformer assembly 400 is supported by the base plate 110.

A concrete foundation 500 is arranged to support the transformer tank 400. Between the foundation 500 and the base plate 110 the elongated continuous band 310 forming the closed frame 300 is arranged between.

The outer periphery of the base plate 111 extends outside the inner periphery 311 (FIG. 2) of the frame 300 and thereby enclosing an air volume 600 within the frame, the base plate 110 and foundation 500. The contact surface of the base plate in contact with the frame forms a first air seal and the contact surfaces between the frame and foundation forms a air second seal.

According to an embodiment the vertical projections of the tank walls 120 fall on the width of the band 310.

The frame 300 forms the full support of the base plate 110 forming the vertical mechanical support of the transformer core 410 (and windings 420).

Figure 4:
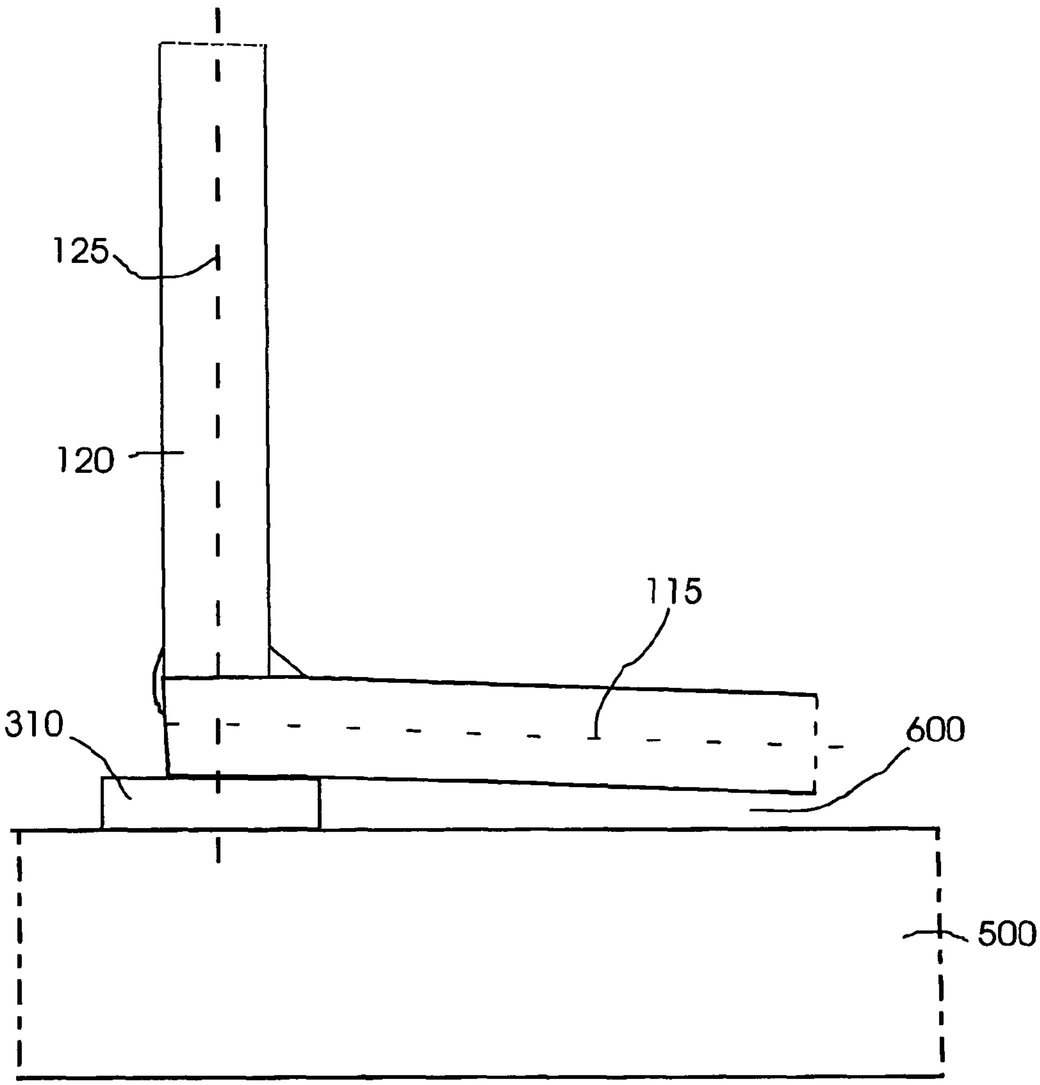

A cross section of a lower corner of the tank is shown in FIG. 4, approximately corresponding to section A in figure 3. The vertical projection of the tank wall 120 falls at the central part of the width of the band 310.

In FIG. 4, 115 is the central line of the base plate 110 and 125 the central line of the tank wall 120. As the base plate 110 and tank wall 120 are joint to each other, any vibration or oscillation of the base plate 110 has a nodal point in the corner approximately where the central lines 110 and 125 meet. According to an embodiment the vertical projection of this node falls at the central part of the band 310.

According to an embodiment, the band 310 is made of oil resistant solid rubber and exhibits a thickness between 10 mm-50 mm, preferably between 20 mm-25 mm and a width between 10 mm-100 mm.

The pressure on the band caused by the total weight of the transformer tank is in the range 0,5-1,0 N/mm$^2$, preferably 0,7 N/mm$^2$ and the rubber hardness is in the range 30A-40A durometer.

By way of example, the power transformer or power reactor has a power in the range 1 MVA to 1000 MVA, the tank has a width between 1 m and 3,2 m, and a length of up to 10 m.

Any range or device value given herein may be extended or altered without losing the effect sought, as will be apparent to the skilled person for an understanding of the teachings herein.

The invention claimed is:

1. A power transformer/reactor immersed in oil, comprising:

transformer/reactor core and windings, a tank comprising tank base plate and tank walls, wherein the tank accommodates the transformer/reactor core and windings a foundation supporting the tank, an elongated continuous pad, comprising oil resistant solid rubber, forming a closed frame arranged between the base plate and the foundation to absorb vibration, the frame forming a full support of the base plate, wherein an outer periphery of the base plate extends outside an inner periphery of the frame, thereby enclosing an air volume within the frame, the base plate and foundation.

2. The power transformer/reactor according to claim 1, wherein a vertical projection of the tank walls fall on a width of the pad.

3. The power transformer/reactor according to claim 1, wherein a vertical projection of the tank walls fall at a central part of a width of the pad.

4. The power transformer/reactor according to claim 1, wherein the frame forms a vertical mechanical support of the transformer/reactor core.

5. The power transformer/reactor according to claim 1, wherein vertical projection of a nodal point of an oscillation of the base plate caused by vibrations in the transformer/reactor core falls on a central part of the pad.

6. The power transformer/reactor according to claim 1, wherein the pad has a thickness between 10 millimeters-50 millimeters and a width between 10 millimeters-100 millimeters.

7. The power transformer/reactor according to claim 1, wherein a pressure on the pad caused by a total weight of the transformer tank is in the range 0.5-1.0 N/ mm$^2$ and a hardness of the rubber is in the range 30A-40A durometer.

8. The power transformer/reactor according to claim 1, wherein the foundation comprises concrete forming a plane surface.

9. The power transformer/reactor according to claim 1, wherein the pad has a thickness between 20 millimeters-25 millimeters and the rubber hardness is in the range 30A-40A durometer.

10. The power transformer/reactor according to claim 1, wherein a pressure on the pad caused by a total weight of the transformer tank is 0.7 N/ mm$^2$ and the rubber hardness is in the range 30A-40A durometer.

* * * * *